United States Patent
Robertson et al.

(10) Patent No.: US 6,323,679 B1
(45) Date of Patent: Nov. 27, 2001

(54) FLEXIBLE PROGRAMMABLE LOGIC MODULE

(75) Inventors: Perry J. Robertson; Robert L. Hutchinson; Lyndon G. Pierson, all of Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 09/439,104

(22) Filed: Nov. 12, 1999

(51) Int. Cl.[7] .......................... H03K 19/177; H03K 19/00
(52) U.S. Cl. ................. 326/39; 326/47; 326/101
(58) Field of Search ........................... 326/93, 41, 37–38, 326/47, 101

(56) References Cited

U.S. PATENT DOCUMENTS

| | | | | |
|---|---|---|---|---|
| 5,239,215 | * | 8/1993 | Yamaguchi | 327/292 |
| 5,537,295 | * | 7/1996 | Van Den Bout et al. | 361/767 |
| 5,585,745 | * | 12/1996 | Simmons et al. | 326/93 |
| 5,649,176 | * | 7/1997 | Selvidge et al. | 713/400 |
| 6,085,317 | * | 7/2000 | Smith | 713/1 |

FOREIGN PATENT DOCUMENTS

404326209A * 11/1992 (JP) ........................................ 326/41

* cited by examiner

Primary Examiner—Michael Tokar
Assistant Examiner—James H. Cho
(74) Attorney, Agent, or Firm—Madelynne Farber; George Libman

(57) ABSTRACT

The circuit module of this invention is a VME board containing a plurality of programmable logic devices (PLDs), a controlled impedance clock tree, and interconnecting buses. The PLDs are arranged to permit systolic processing of a problem by offering wide data buses and a plurality of processing nodes. The board contains a clock reference and clock distribution tree that can drive each of the PLDs with two critically timed clock references. External clock references can be used to drive additional circuit modules all operating from the same synchronous clock reference.

8 Claims, 3 Drawing Sheets

FLEXIBLE PROGRAMMABLE LOGIC MODULE

The United States Government has rights in this invention pursuant to Department of Energy Contract No. DE-AC04-94AL85000 with Sandia Corporation.

BACKGROUND OF THE INVENTION

1. Field of the Invention

This invention relates generally to a circuit module for utilizing a number of programmable logic devices (PLDs), and specifically in the area of reconfigurable high speed communication protocol processing.

2. Description of Related Art

A programmable logic device (PLD) is an integrated circuit device with configurable logic, flip-flops and/or RAM linked together with programmable interconnect. Most PLDs are arranged so that data flows most efficiently either along a plurality of parallel rows or a plurality of parallel columns transverse to the rows. The logic is defined by programming the interconnect using RAM, ROM, EEPROM or fusable links. Though various devices use different architectures, all are based on this fundamental idea.

Present PLD devices do not have the wide data path or large number of programmable gates needed for many aggressive applications. Currently available reconfigurable logic circuit cards are targeted for reconfigurable computing applications rather than reconfigurable high-speed communications protocol processing. None of these currently available products has a large gate count in few logic devices. Nor do these currently available products incorporate infinitely extensible clocking to multiple boards. The processing of communication protocols in general purpose computing hardware is difficult to scale to 10 to 100 Gigabit/second (Gb/s) throughputs, due to individual bit operations that typically require many instruction cycles per data unit processed. Therefore, it is necessary to provide wide high speed parallel processing in excess of 400 bits. Also, basic logic devices are expandable as ever higher density devices become available.

An application specific integrated circuit (ASIC) is a custom chip designed for a specific application. It is designed by integrating standard cells from a library. ASIC design is faster than designing a chip from scratch, and design changes can be made more easily. The current crop of digital emulators used in the development of CMOS ASICs are expensive (>$100K) and generally limited to a specific set of devices.

The representative cross section of available reconfigurable logic board products fall into the following categories: 1) small gate count, low cost boards; 2) small gate count, moderately expandable boards; 3) medium gate count, highly flexible on-board interconnect boards; 4) large gate count boards intended for reconfigurable computing applications; and 5) large gate count boards with wide data paths suitable for reconfigurable communication protocol processing applications. The state of the art in marketed reconfigurable logic circuit boards in each of the aforementioned categories are represented by: 1) Associated Professional Systems, APS-L84 (20,000 gates, $850); 2) Virtual Computer Corp., EVC1 (20,000 gates, limited expandability); 3) APTIX, MP4 (estimated 300,000 gates); 4) Virtual Computer Corp., P-Series Reconfigurable computers (1.04 million gates; 0.8 million gates in virtual processing array); and 5) the present invention (1.1 million gates, 384 bit wide data path).

The APS-L84 made by Associated Professional Systems uses a Lucent 2C15A PLD device. This product has comparatively narrow data paths (80 bits) and no expansion capability. Its gate count is 20,000. It utilizes an ISA interface. The APS-L84 is incapable of high speed operation.

Virtual Computer Corporation's EVC1 utilizes a Xilinx 4020 PLD device. The EVC1 has 96 bit wide data paths and limited expansion capability. Additionally, the components on the board are only capable of operation as high as 50 MHz; the current invention is capable of operation as high as 100 MHz. The EVC1 uses a SBus as its interface.

Although it has an estimated 300,000 gates in conjunction with 160 bit wide data paths, the APTIX MP4 is still incapable of high speed operation. The Lucent, Xilinx and Altera PLD devices used by the MP4 are only capable of operation as high as 50 MHz. It has limited expansion capability and no interface.

One related product is the P-Series VIRTUAL COMPUTER™ (P4) made by Virtual Computer Corporation. Even though this product has much narrower data paths (32 bits) and limited expansion capability (32 boards), it is the only one with a sizable number of gates (1.04 million gates). The P4 board uses SRAM based PLD technology but at greatly reduced chip complexity (Xilinx 4020 only contains 2,000 gates). This allows for far greater complexity logic blocks without the difficulty of partitioning the design into small logic blocks. The P4 can be expanded to only 32 boards operating in parallel. The P4 board does not appear to have a way of storing its configuration (no PROMs). It appears that the PSVC must be connected to a SBus (SUN Workstation) or similar host to operate. The P4 uses I-Cube IQ-160's for connection between PLDs. The IQ-160 is a switch matrix crossbar with 160 I/O pins. The bus between parts is limited to 32 bits and 4 virtual channels. The observability of the P4 buses is reduced since there is no apparent way to debug the P4 other than by using scan bits. Access to the internal buses of the P4 is limited.

SUMMARY OF THE INVENTION

It is an object of this invention to provide a flexible board so a plurality of PLDs can be reprogrammed quickly and easily to accomplish any given task.

It is another object of this invention to enable switching of wide data paths in a single clock cycle among a plurality of PLDs.

It is another object of this invention to overcome common clock distribution problems by enabling a single clock source to drive multiple boards.

It is also an object of this invention to deliver the clock to multiple PLD's in a system with very little clock skew.

It is also an object of this invention to provide nearly infinite expandability.

Additional objects, advantages, and novel features of the invention will become apparent to those skilled in the art upon examination of the following description or may be learned by practice of the invention. The objects and advantages of the invention may be realized and attained as particularly pointed out in the appended claims.

To achieve the foregoing and other objects, and in accordance with the purpose of the present invention, as embodied and broadly described herein, an embodiment of the present invention comprises a flexible programmable logic module comprising a printed circuit board having electrical inputs and outputs, and electrically conductive paths connected to said inputs and outputs. A plurality of programmable logic devices (PLDs) are mounted on the board and electrically interconnected to each other and said inputs and outputs by the conductive paths, and a clock system delivers clock pulses simultaneously to all the PLDs without clock skew.

BRIEF DESCRIPTION OF THE DRAWINGS

The accompanying drawings, which are incorporated in and form part of the specification, illustrate an embodiment of the present invention and, together with the description, serve to explain the principles of the invention.

DETAILED DESCRIPTION OF THE INVENTION

Figure 1:
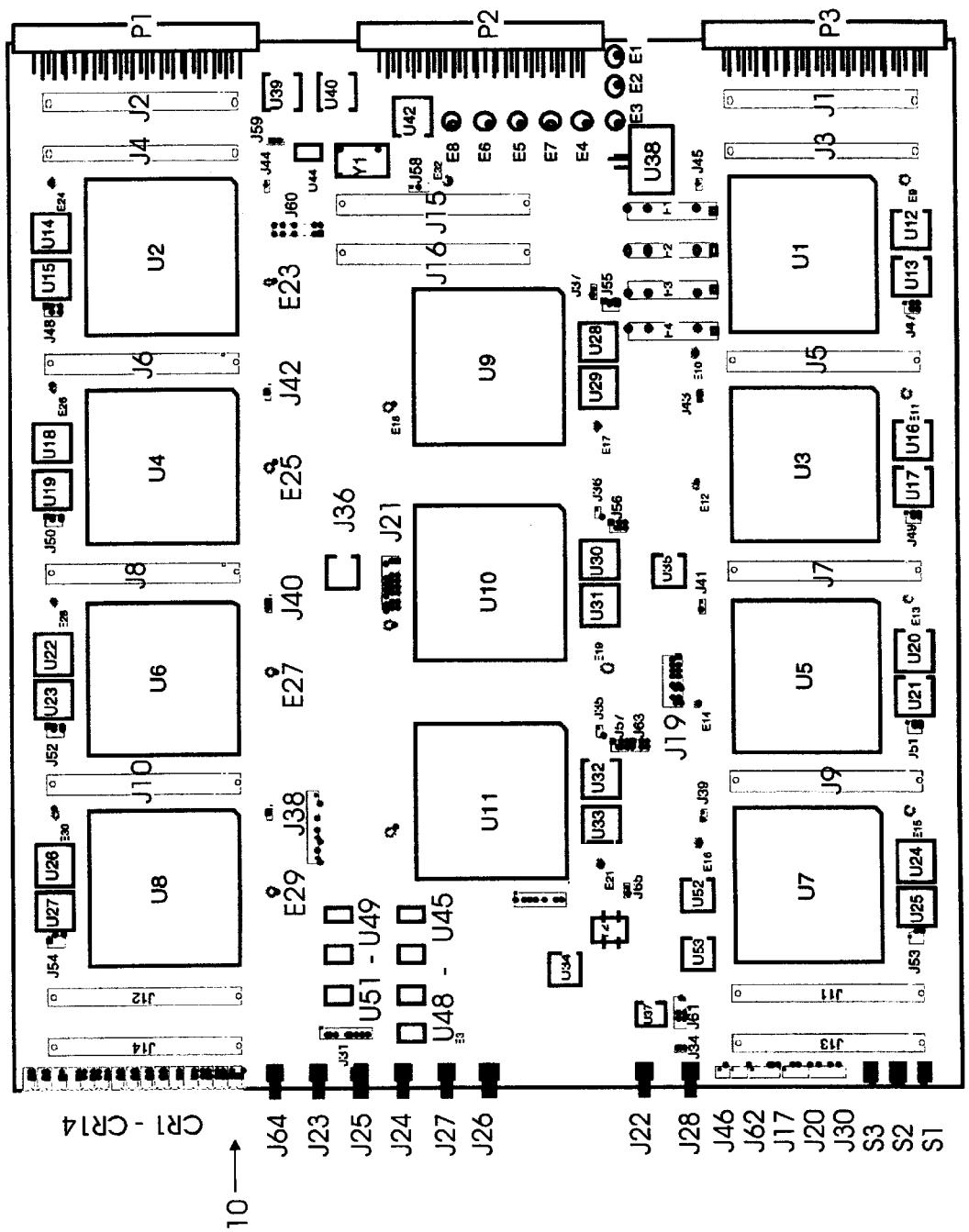
FIG. 1 shows placement of the components on the front side of this invention.

FIG. 1 shows the layout of the front side of a preferred embodiment of the circuit module of this invention. In this embodiment, the circuit module is configured with a 9U×400 VME form factor (14.44"×15.75") multilayer circuit module 10 containing sockets for a plurality of Programmable Logic Devices (PLDs). The disclosed embodiment uses eleven Altera 10K100 PLDs, U1–U11.

As is conventional in the art, VME boards are connected to a VME bus on a computer using 96 pin connectors, P1, P2, P3. The number of connectors is determined by the height of the VME board. VME uses a standard unit of height called a "U"; 9U boards have three connector. P1 is the primary connector for VME bus communications and allows for 24 address lines and 16 data lines. P2 expands the number of address and data lines to 32. In addition, P2 and P3 each have 64 user definable or spare pins. These spare pins can be used to move data between multiple boards 10 independent of the VME interface. In addition to data signals, power may also be provided through each of the three connectors.

Module 10 has a standard VME bus interface utilizing a Cypress CY7C960NC logic circuit U39 and Cypress CY7C964 controllers U40, U42 on the front and two more controllers on the back. These devices allow module 10 to respond to VME intiated data transfers. Internal timing may be provided by a 50 MHz crystal oscillator (EPSON SG-8001JA) Y2 and clock distribution circuitry shown in FIG. 3 and discussed hereinafter clock distribution circuitry shown in FIG. 3 and discussed hereinafter. A serial interface that may be used as a computer terminal interface (U52, U53 and J61) and a 155 Mbps Utopia 1 ATM interface are also provided. Two onboard ROMs (such as U12 and U13) associated with each PLD (such as U1) may contain the programming instructions for the PLD to provide the circuit module with stand-alone capabilities. The PLDs U1–U11 on the circuit module are capable of operation as high as 100 MHz. Each PLD has approximately 100,000 programmable gates, enabling the entire circuit module to act as a single, large PLD. Programming of PLDs is known technology. Conventional trace technology is utilized to interconnect these elements in a manner well known to those of ordinary skill in the art. A serial interface that may be used as a computer terminal interface (U52, U53 and J61) and a 155 Mbps Utopia 1 ATM interface are also provided. Two onboard ROMs (such as U12 and U13) associated with each PLD (such as U1) may contain the programming instructions for the PLD to provide the circuit module with stand-alone capabilities. The PLDs U1–U11 on the circuit module are capable of operation as high as 100 MHz. Each PLD has approximately 100,000 programmable gates, enabling the entire circuit module to act as a single, large PLD. Programming of PLDs is known technology. Conventional trace technology is utilized to interconnect these elements in a manner well known to those of ordinary skill in the art.

The circuit module 10 is designed to provide a very wide interface for high throughput applications. Eight 100 pin connectors J1–J4 and J11–J14 provide access to the wide data path lines and are suitable to support daughter cards such as A/D or D/A converters, memory, high speed mux/demux or DSP processors. The circuit module is also designed to accommodate a plurality of boards, each interconnected to provide expandability either in serial or parallel fashion. This expandability potentially brings tens of millions of programmable gates to bear on any given computational or communications problem.

Each circuit module can drive the clock input of up to five other boards, with each clock phase locked and/or phase adjusted to the master, providing for nearly infinite expandability. Programming of the circuit module can be performed using either VHSIC (Very High Speed Integrated Circuit) Hardware Description Language (VHDL) or as Altera's Hardware Description Language (AHDL) downloaded into the circuit modules or from on-board ROMs, making the circuit module readily available to digital designers.

The arrangement of the PLDs in rows and columns mimics the internal construction of each PLD. Just as data flows most efficiently within a PLD in either a row or a column, data flows most efficiently within module 10 between PLDs along a row or a column. Just as data may be switched from a row to a column within a PLD, a PLD may be used to switch data from a row to a column within module 10; however, such directional switching should be minimized if the data throughput of the device is to be maximized.

In the disclosed embodiment, PLDs are arranged in a 2 row by 4 column matrix with three central PLDs U9–U11 being placed to perform data switching tasks between the PLDs in the upper and lower rows. This matrix could also be any m×n matrix with each row having equal capabilities, including input and output data connectors.

Figure 2:
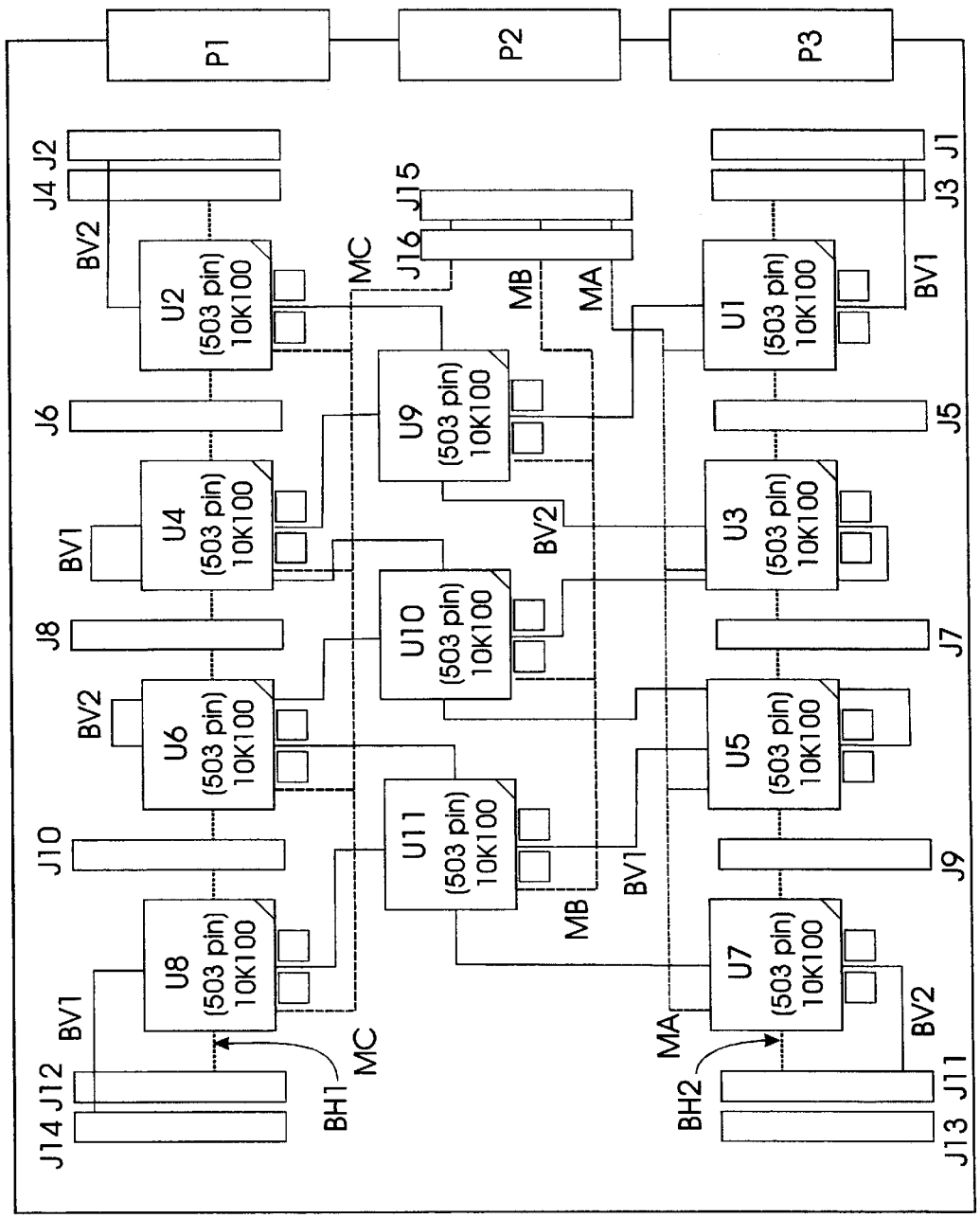
FIG. 2 shows the bus routing of this invention.

The bus routing of a preferred embodiment of the circuit module is shown in FIG. 2. The odd numbered PLDs U1, U3, U5, U7 are located along the bottom of circuit module 10 and the even numbered components U2, U4, U6, U8 are located along the top of the circuit module. Components U9–U11 are located in the middle of the circuit module and act as interconnect between the top and bottom rows. These three devices U9–U11 can be used either to provide a switching function between the upper and lower buses or to perform additional logic transforms between PLDs. Alternatively, an equal number of PLDs could be provided in the middle row as in each of the top and bottom rows, these PLDs performing similar functions as their neighbors.

Because most typical applications require some level of global routing to coordinate activities among the different devices, there are three 16 bit buses which connect the devices in parallel. These buses are designated MA, MB and MC in FIG. 4. MA connects to U1, U3, U5 and U7 on the top of the board. MB connects to U2, U4, U6 and U8 along the bottom of the board. MC connects U9–U11 in the middle of the board. Each of these buses are connected in parallel to connectors J15 and J16 to provide a pseudo backplane among multiple modules 10 by interconnecting J15 from one board to J16 of another board. These connectors may be placed on alternate sides of the module to accomplish these connections. These buses are used to distribute global data to all PLDs on all boards of a system or configuration.

For this embodiment, other buses are arranged to provide 192 I/O lines on the top and another 192 I/O lines on the bottom through the circuit module. These buses can be used together as a single 384 bit wide bus (which is very advantageous for asynchronous data transmission applications) or can be divided into four 96 bit buses. Bus BV1 connects the columns of certain PLDs to respective the columns of adjacent PLDs in other rows of the array as it snakes from connector J1 through the sockets for PLDs U1, U9, U4, U10, U5, U11, and U8 to connector J14. Similarly, bus BV2 goes from connector J2 through the sockets for PLDs U2, U9, U3, U10, U6, U11, and U7 to connector J13. Because PLDs U9–U11 function as switching elements in the disclosed embodiment, the BV buses may utilize the rows of these devices, as does BV2 with U9 and U11, and BV1 with U10. Bus BH1 connects the rows of one row of PLDs to the respective rows of adjacent PLDs in the same row as it extends from connector J4 to the sockets for PLDs U2, U4, U6, and U8 to connector J12, with parallel connections to intermediate connectors J6, J8, and J10. Similarly, bus BH2 extends from connector J3 through the sockets for PLDs U1, U3, U5 and U7 to connector J11, while passing intermediate connectors J5, J7 and J9. These connectors serve either as diagnostic ports for module 10 or as means for connecting the data at that location to another module.

There is no particular direction (left-to-right or right-to-left are equally valid, as are up-to-down and down-to-up) to the bus routing on the circuit module. Even a vertical direction can be a viable choice. For design purposes, J1–J4 are the "input" connectors providing access to twelve 32 bit buses (four 96 bit buses) for a total of 384 I/O lines through the board. J11–J14 are the output connectors. Since the components U1–U11 can be clocked as high as 100 MHz, the circuit module is capable of an aggregate bit rate as high as 38.4 Gbps. Additional boards may also be connected and operated in parallel to provide incrementally higher throughput by widening the data bus.

The 384 digital lines of the preferred embodiment (extending from the four 96 pin connectors J1–J4 to connectors J11–J14) of the circuit module are designed to be about 75 ohm, 5 mil traces; this impedance was chosen to reduce reflections between circuit modules. Although these voltage reflections are always present in electrical interconnections between devices and have traditionally been ignored, transmission line effects cause many undesirable results in high-speed systems. The ribbon cable (not shown) connecting the 96 pin connectors to the computer should also be 75 ohm impedance. The input and output bus connectors J15 and J16 have 75 ohm terminators that can be placed on the circuit module if needed to control overshoot on the bit lines. Simulations have shown that the overshoot can be considerable if the length of the interconnect between circuit modules is greater than about three inches.

The aforementioned interconnections permit systolic processing of data through module 10 in a pipelined manner at very high speed. For example, PLDs are recognized as having a faster throughput along a straight path of either a row or a column than along a right angle path of a column to a row or a row to a column. Accordingly, up to 96 bits of data could be loaded into J4 for processing by a PLD at U2 while another 96 bits of data is loaded into J3 for processing by a PLD in U1. When the first set of PLDs at U2 and U1 have finished their operations, this data may transmitted to a second set of PLDs at U4 and U3 for subsequent processing, while another 96 bits is applied to the first set of PLDs. By processing the data in this manner, the problem is broken into many small pieces for processing by the various PLDs on module 10, and the data moves from through the PLD array in an efficient manner.

In one encryption application, 64 bits of data and 56 bits of key data were clocked into module 10 on the rising edge of the clock, which was provided synchronously with the data on a separate input line. This data was encrypted using internally programmed logic and, after a number of clock cycles, encrypted data passed from the board as a 64 bits wide data word. In another application, two 128 bit wide data words representing ATM data, control signals, and clocks were passed to a 2.4 Gbps network card which formatted the data into Sonet packets for transmission over an ATM network.

The variation in arrival time of two signals specified to occur at the same time is called skew. The driving device output skew and the board delay variation caused by output trace layout differences are the components of skew. Skew affects synchronous systems primarily in the form of clock skew. Any variation in the arrival of the clock signal at its destination will directly impact system performance. The clock signal drives many system components and all of these components should receive their clock signal at precisely the same time in order to be synchronized. Skew directly affects system margins by eroding the predictability of the arrival of a clock edge. Because elements in a synchronized system require the arrival of simultaneous clock signals, clock skew reduces the cycle time within which information can be passed from one device to the next. There are two types of clock skew: intrinsic and extrinsic.

Intrinsic clock skew is the amount of skew caused by the clock driver or buffer itself. Board layout or any other design issues, except for those noted on the clock driver data sheets, are not components of intrinsic skew. In a buffer-style clock driver, the input waveform propagates through the device and is "redriven" by the output buffers. This "redriven" output signal directly follows the input signal. Differences in propagation delay between the input signal through the device and the precision of the matching and tuning of the internal circuit elements are the causes of output skew in buffer-style clock drivers. To overcome this effect, another type of clock distribution device uses a feedback input that is a function of one of the outputs. The use of phase-locked loops (PLL) to align the phase and frequency of the feedback and reference inputs usually forms the basis for this second type of clock distribution device. The result of PLL use is the virtual elimination of propagation delay through the device.

Figure 3:
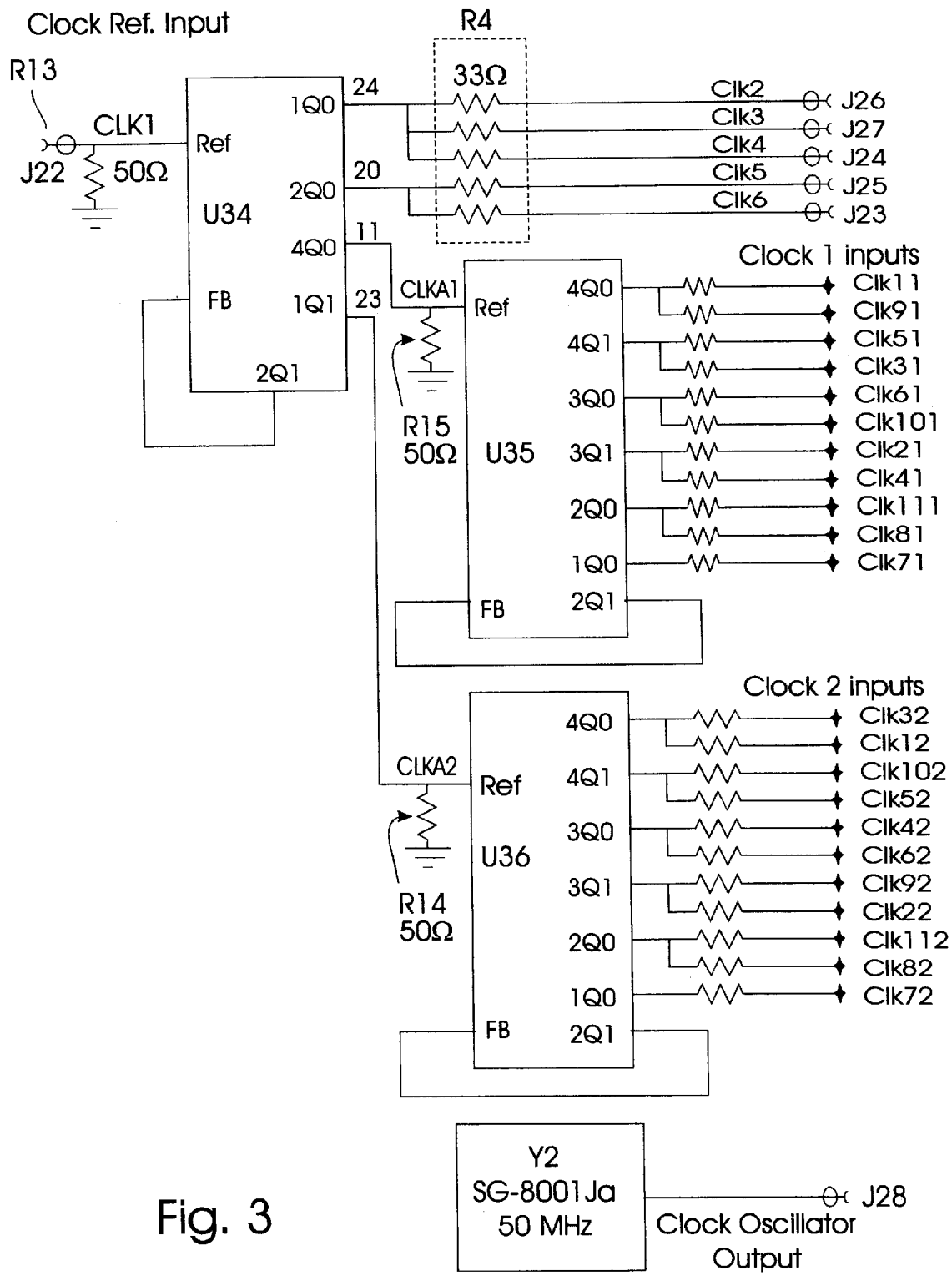
FIG. 3 shows the clock distribution of this invention.

As shown in FIG. 3, this embodiment of the invention uses three Cypress CY7B991-5JC, Programmable Skew Clock Buffers U34–U36 (PSCB, called ROBOCLOCK™). ROBOCLOCK™ is an eight-output, zero phase clock driver device that differs from traditional clock drivers and buffers in that its outputs, while having very low output skew, can also be phase adjusted, inverted, divided, and multiplied. Phase adjustment allows outputs to shift in time relative to a reference point, which is usually the input clock to the device. ROBOCLOCK™ includes a phase-locked loop (PLL) to achieve zero propagation delay. A completely integrated PLL allows alignment of both the phase and the frequency of the reference inputs with an output. A key component of the PLL is the Distributed Phase Clock Oscillator and Output Adjust Matrix. The output delays are selected via two dedicated three-level junction select inputs that allow the outputs to be phase adjusted by as much as ±18 ns, divided, multiplied, or inverted. In all, over 26,000 different combinations are possible.

A three-level frequency select input selects one of three PLL operating ranges that allow the outputs of PSCBs U34–U36 to operate from 3.75 to 80 n MHz. All of these device configurations are possible while still maintaining an output-to-output skew and propagation delay no greater than 500 ps. The clock skew of each output from the ROBOCLOCK™ chip is easily adjustable by setting the jumpers on J18, J19 and J21. These jumpers control the output skew of devices U34, U35 and U36, respectively. Each input controls the skew or frequency selection of one output. The inputs are tri-state and can be set either LOW (connected to ground), HIGH (connected to +5V) or MEDIUM (left floating, no jumper).

Extrinsic clock skew is related to board design and includes trace length, capacitive loading, transmission line termination, and threshold voltages at the loads. Further, the time that it takes for a signal to propagate down a trace is dependent on such factors as the circuit board material, the signal trace length, the trace width, and capacitive loading. Trace to trace variations in any of these factors will result in skew.

In this embodiment, the circuit module 10 of FIG. 1 consists of fourteen layers: eight routing layers and six power planes. The total thickness of the circuit module is 0.093 inches. It is constructed of green FR4 material having a relative dielectric constant of 4.1. The routing lines are 5 mil traces and are designed to be 75 ohms. Layout of these layers is accomplished by one of ordinary skill utilizing commercially available schematic capture and layout software.

The clock distribution circuit FIG. 3 is capable of delivering the reference clock in phase to each PLD U1–U11 on the circuit module with very little clock skew. In addition, it has been designed to allow for the adjustment of the skew as well as the phase and frequency of the clock. The clock distribution supports multiple circuit module implementations and allows a single clock to be distributed to PLDs on multiple circuit modules in phase with very little clock skew. The distribution tree is shown in FIG. 3. All lines of the clock distribution circuit have a 50 ohm impedance and are all of equal length; with the multiple layers of the circuit board providing space for equal length traces to extend to each PLD in a manner well known to circuit board designers. A single clock input CLK1 on the circuit module connects to the zero phase delay clock buffer chip U34. This line is parallel terminated into an equivalent 50 ohms circuit R13. Two outputs from U34 run to the inputs of U35 and U36 and are also parallel terminated into equivalent 50 ohms circuits R15 and R14. Five other outputs from U34 run though 33 ohm serial resistors R4 to SMA connectors J23–J26 at the edge of the circuit module. These clock out lines CLK2–CLK6 are used to time multiple circuit modules in parallel.

Each Altera 10K100 PLD has two clock inputs. The clock 1 inputs CLKA1 are connected to U35 via serial terminations. The clock 2 inputs CLKA2 are connected to U36 via serial terminations. In this way, each clock buffer chip can be programmed to provide two phase clocks to the inputs of the PLDs if needed. Skew of each clock line may be individually adjusted via jumpers on J18, J19 and J21, FIG. 1.

In this embodiment, a crystal oscillator Y2 has been included on the board. It is an EPSON SG-8001JA, 50 MHz oscillator whose output is connected to J28 at the edge of the board. Devices of different frequencies can be used as needed by application requirements.

The circuit module 10 can be configured to operate from either the VME power supply via P1–P3 or from an external power supply. Pins E1–E7 are available to configure the supplies. The key is the ability to power the I/O at 3.3 volts. The power from the VME bus is limited by the number of pins available for power. The VME supply and circuit module power routing are not normally connected. A jumper between the VME pins and the circuit module power plane pins is required to use the VME supply. The VME bus power is generally limited to under 9 amps at 5 volts (or about 1 amp per VME supply pin). A fully populated (in this embodiment, eleven Altera 10K100 devices U1–U11) circuit module can pull as much as 30 amps from +5 volts when operating at 50 MHz. The actual power dissipation will depend upon the number of devices on the circuit module and the clock frequency.

The location of the connectors on the preferred embodiment of the circuit module are shown in FIG. 1. The buses that pass through these connectors are shown in FIG. 2. J1–J14 are 100 pin connectors through which almost all buses pass. These connectors each have a 96 bit bus and four power and ground connections. The power and ground connections are the same for all connectors and are: (97) +5V, (98) –12V, (99) +12V and (100) GND. J15 and J16 are connected in parallel to the three common 16 bit buses that run to all devices on the circuit module. The three buses MA, MB and MC are shown in FIG. 2. J18, J19 and J21 are the RoboClock™ skew programming pins. J17, J20, J30, J46 and J62 are located on the outer edge of the circuit module. J17 is the passive serial bit blaster interface. J20 is the Global Input connector providing a common connection to all I1, I2, I3 and I4 pins on the PLDs. J30 is the JTAG connector. J46 is the input/output connection to the serial programming chain. J62 is the serial I/O connector. J22–J28 are SMA connectors for the clock. J29 consists of jumper pins to skip missing PLD devices in the JTAG chain. J31 consists of spare LED connections. J32 and J33 (FIG. 4) are connectors to the ATM interface module. J34 is a connection to the spare debounced switch S3. J35–J45 are two pin connectors with +12V and GND for the cooling fans. J47–J57 are 6 pin connectors used to skip missing PLD devices for the serial programming chain. J58–J60 are for VME programming. J61 is the RS232 serial connector.

The circuit module of this invention is designed to be used with several applications including high speed digital communications modulator/demodulator algorithm development, high speed digital ASIC real time emulation, reconfigurable logic development, 10 Gbps ATM switching and protocol processing, high speed encryption/decryption, and parallel processor design.

The circuit module can be used by itself or in multiple module configurations to support any design that can be represented in VHDL or other hardware description language, such as AHDL. The utilization of multiple modules enables the user to solve virtually any size problem. For these applications, data could flow from connectors J10, J8, J6 of one module through ribbon cables to connectors J9, J7, J5, respectively, of another module, or the connectors on the back of one module could mate directly with the connectors on the front of another module. In this manner, data could be passed between boards as easily as it is passed between PLDs on a module.

The circuit module can be used for rapid generation of test vectors for testing and verification of ASICs. This process can be made transparent to the ASIC designer by integrating the process (downloading the compiled VHDL into the circuit module, running a vector set through the board and reading out the results) with the ASIC design tools. The board also can be used for development of Public Key Cryptography, Bit Error Rate test equipment, image filtering acceleration, SAR Radar image processing, and real time CMOS chip emulation.

In general, the principal applications for the circuit module are for rapid prototyping of high bandwidth applications without having to develop specific hardware for the application. Future applications include the emulation of reprogrammable software algorithms based on more traditional programming languages such as C and use as a general purpose digital modulator/demodulator, with the addition of analog interface boards. Application of this technology has the potential to move high speed communications from research labs and central offices to the consumer electronics market. It is a springboard for the development of low cost, high speed interactive multimedia terminals. This circuit module will ultimately enable cheaper, faster, and better productivity in research, office, and home applications. This new technology will become increasingly necessary in order to meet the never-ending consumer demand for increased communication speed.

The particular sizes and equipment discussed above are cited merely to illustrate a particular embodiment of this invention. It is contemplated that the use of the invention may involve components having different sizes and shapes as long as the principle of utilizing scalable, reconfigurable hardware to achieve the flexibility and extensibility to solve a wide variety of computing and simulation/emulation problems by enabling switching of a plurality of wide data paths in a single clock cycle and maintaining the clock phase to all PLDs in the system with a single clock source while providing for nearly infinite expandability, is followed. It is intended that the scope of the invention be defined by the claims appended hereto.

We claim:

1. A flexible programmable logic module comprising:

a printed circuit board having electrical inputs and outputs, and electrically conductive paths connected to said inputs and outputs;

a plurality of programmable logic devices (PLDs) mounted on said board in an array of rows and columns and electrically interconnected to each other and said electrical inputs and outputs by said conductive paths; wherein each PLD includes a plurality of parallel rows of data paths and a plurality of parallel columns of data paths, the parallel rows of each PLD being connected by a bus to the respective parallel rows of each adjacent PLD in a row of the array;

a clock system for delivering clock pulses to all said PLDs and an input connector connected by said bus to the parallel rows of a first PLD at one end of each row of PLDs, and an output connector connected by said bus to the parallel rows of a last PLD at the other end of each row of PLDs.

2. The module of claim 1 wherein the parallel columns of each PLD in one row are connected by a bus to the respective parallel columns of a PLD in another row; and an input connector connected by said bus to the parallel columns of each first PLD, and an output connector connected by said bus to the parallel columns of each last PLD.

3. The module of claim 2 further comprising another row of PLDs between each two rows of PLDs of said array, each PLD of said another row being connected by said buses only to PLDs in adjacent rows.

4. The module of claim 1 wherein said clock system generates a plurality of clock outputs, at least one of said outputs being connected through traces to each PLD, said system including skew means for having each clock pulse arrive at each PLD at the same time.

5. The module of claim 4 wherein said skew means includes having all clock traces be identical in length and impedance.

6. The module of claim 4 wherein said skew means includes having means for adjusting the phase of each clock output.

7. The module of claim 1 further comprising an intermediate connector connected in parallel to each bus extending between a pair of PLDs.

8. The module of claim 1 further comprising a global routing bus for each row of PLDs, each said bus extending forming a parallel connection with each PLD in a row and extending to a connector.

* * * * *